(12) United States Patent
Ye et al.

(10) Patent No.: US 12,506,095 B2
(45) Date of Patent: Dec. 23, 2025

(54) WAFER BONDING STRUCTURE, WAFER BONDING METHOD AND CHIP BONDING STRUCTURE

(71) Applicant: WUHAN XINXIN SEMICONDUCTOR MANUFACTURING CO., LTD., Hubei (CN)

(72) Inventors: Guoliang Ye, Hubei (CN); Hongsheng Yi, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 428 days.

(21) Appl. No.: 18/014,009

(22) PCT Filed: Nov. 17, 2020

(86) PCT No.: PCT/CN2020/129221
§ 371 (c)(1),
(2) Date: Dec. 30, 2022

(87) PCT Pub. No.: WO2022/021677
PCT Pub. Date: Feb. 3, 2022

(65) Prior Publication Data
US 2023/0343733 A1    Oct. 26, 2023

(30) Foreign Application Priority Data
Jul. 31, 2020   (CN) .......................... 202010762646.9

(51) Int. Cl.
*H01L 23/00* (2006.01)
*H01L 21/18* (2006.01)

(52) U.S. Cl.
CPC ............ *H01L 24/03* (2013.01); *H01L 21/185* (2013.01); *H01L 24/05* (2013.01); *H01L 24/08* (2013.01);
(Continued)

(58) Field of Classification Search
CPC ....... H01L 21/185; H01L 24/05; H01L 24/08; H01L 2224/05018; H01L 2224/08145;
(Continued)

(56) References Cited

U.S. PATENT DOCUMENTS

2016/0013160 A1    1/2016  Chun et al.

FOREIGN PATENT DOCUMENTS

CN    1387249 A    12/2002
CN    1153277 C  *  6/2004
(Continued)

*Primary Examiner* — Mamadou L Diallo
(74) *Attorney, Agent, or Firm* — MUNCY, GEISSLER, OLDS & LOWE, P.C.

(57) ABSTRACT

The present invention provides a wafer bonding structure, a wafer bonding method and a chip bonding structure. A first wafer has non-metallic regions and metallic regions provided with a first metal layer. A portion of a first modification layer located above the non-metallic regions is recessed with respect to a portion of the first modification layer located above the metallic regions. A second modification layer covers the first modification layer. A chemical mechanical polishing process is performed on the second and first modification layers, which uses a polishing slurry exhibiting different polishing rates for the first and second modification layers, and as a result of which, the remaining second modification layer above the non-metallic regions is raised or recessed with respect to the remaining first modification layer above the metallic regions, resulting in the formation of first convex portions or first concave portions above the non-metallic regions. When this wafer is bonded to a wafer (Continued)

or dies with corresponding concavities or convexities, less gaps will be left from the bonding, improving process quality and product yield. Moreover, local concavities resulting from the CMP process can be eliminated or reduced, alleviating the problem of gaps left between bonded upper and lower wafers and achieving enhanced bonding strength and quality.

16 Claims, 3 Drawing Sheets

(52) U.S. Cl.
CPC ............... *H01L 2224/03452* (2013.01); *H01L 2224/03616* (2013.01); *H01L 2224/05018* (2013.01); *H01L 2224/05084* (2013.01); *H01L 2224/05558* (2013.01); *H01L 2224/08059* (2013.01); *H01L 2224/08145* (2013.01); *H01L 2924/37001* (2013.01)

(58) Field of Classification Search
CPC . H01L 2224/80895; H01L 2224/80896; H01L 24/80; H01L 24/04; H01L 2224/03602
See application file for complete search history.

(56) References Cited

FOREIGN PATENT DOCUMENTS

| | | | |
|---|---|---|---|
| CN | 101121245 | A | 2/2008 |
| CN | 110896025 | A | 3/2020 |
| CN | 110911292 | A | 3/2020 |
| CN | 111223774 | A | 6/2020 |
| CN | 111276398 | A | 6/2020 |
| CN | 111863643 | A | 10/2020 |
| JP | H10256201 | A | 9/1998 |
| JP | 2004335745 | A | 11/2004 |
| TW | 201528463 | A * | 7/2015 |

* cited by examiner

WAFER BONDING STRUCTURE, WAFER BONDING METHOD AND CHIP BONDING STRUCTURE

TECHNICAL FIELD

The present invention pertains to the field of integrated circuit fabrication technology, and relates in particular to a wafer bonding structure, a wafer bonding method and a chip bonding structure.

BACKGROUND

In 3D-IC technology, wafers are usually bonded by hybrid bonding involving metal-metal bonding and dielectric-dielectric bonding. This approach accomplishes intermolecular bonding between dielectric areas and electrical connection between metal areas of the bonding surfaces at the same time, and therefore imposes very stringent requirements on the bonding surfaces. On two wafers to be bonded together, dielectric layers are typically provided for electrical isolation and morphological modification. The dielectric layers may be processed using chemical mechanical polishing (CMP) to achieve an ideal morphology for wafer-level bonding. At the micron and sub-micron scales, surface non-flatness of a metal layer filled in a single opening can be generally controlled by selecting a polishing slurry with a suitable dielectric-to-metal polishing rate ratio. At the micron scale, this surface non-flatness of a metal layer filled in a single opening can be accepted for bonding.

Although processing bonding surfaces with existing CMP processes can control surface morphologies of wafers and metal layers filled in single openings, non-flat morphological conditions are seen at the microscopic scale of 0.1-10 mm, in particular at dicing lanes around dies, where there are only dielectric materials but not metals. Due to polishing rate ratios of CMP slurries, the dielectric materials at said locations are removed slightly faster, leading to microscopic morphological conditions with several nanometers deep concavities. When bonded, gaps may be formed at the concavities of the wafers, which will ultimately degrade the bonding strength and quality. Further, in some applications, local convexities and non-flatness on dielectric layers are other causes of degraded bonding strength and quality.

SUMMARY OF THE INVENTION

It is an object of the present invention to provide a wafer bonding structure, a wafer bonding method and a chip bonding structure, which enable improved microscopic morphologies by forming convexities or concavities on a wafer or chip. This wafer or chip is intended to be bonded to another wafer or chip with such convexities or concavities. In this way, increased bonding strength and quality can be obtained.

The present invention provides a wafer bonding method, including:
  providing a first wafer including a first substrate and a first metal layer located above the first substrate, wherein the first wafer comprises non-metallic regions and metallic regions provided with the first metal layer;
  forming a first modification layer covering the first metal layer and the first substrate, wherein a portion of the first modification layer located above the non-metallic regions is recessed with respect to a portion of the first modification layer located above the metallic regions;
  forming a second modification layer covering the first modification layer; and
  performing a CMP process on the second and first modification layers, wherein a polishing slurry used by the CMP process exhibits different polishing rates for the first and second modification layers, so that the first modification layer and a portion of the second modification layer remain above the non-metallic regions, and a portion of the first modification layer remains above the metallic regions, wherein a surface of the second modification layer remaining above the non-metallic regions is raised or recessed with respect to a surface of the first modification layer remaining above the metallic regions, resulting in a formation of first convex portions or first concave portions above the non-metallic regions.

Additionally, the first modification layer may be formed by an HDP-CVD process and the second modification layer may be formed by a TEOS deposition process.

Additionally, the polishing rate of the polishing slurry for the second modification layer may be lower than the polishing rate thereof for the first modification layer.

Additionally, the first modification layer may be formed by the HDP-CVD process with process parameters including: a chamber pressure of 5 mTorr-10 mTorr; a top RF source power of 1200 W-1300 W; a side RF source power of 3000 W-3100 W; and a bias RF power of 3200 W-3300 W.

Additionally, the first modification layer may be formed by the HDP-CVD process with process gas parameters including: an argon flow rate of 105 sccm-115 sccm; an oxygen flow rate of 120 sccm-130 sccm; and a silane flow rate of 115 sccm-125 sccm.

Additionally, the formation of the second modification layer by the TEOS deposition process may include:
  vaporizing liquid TEOS into gaseous TEOS;
  introducing an oxygen and the gaseous TEOS into a reactor chamber; and
  decomposing the oxygen and the gaseous TEOS and forming the second modification layer by a reaction of products resulting from the decomposition.

Additionally, the liquid TEOS may be vaporized at a temperature of 80° C. to 120° C., wherein:
  the oxygen is introduced into the reactor chamber at a flow rate of 2000 sccm to 4500 sccm and the gaseous TEOS is introduced into the reactor chamber at a flow rate of 500 sccm to 1500 sccm; and
  the oxygen and the gaseous TEOS are decomposed by an RF, wherein a power of the RF ranges from 300 W to 800 W.

Additionally, each of the first modification layer and the second modification layer may be formed of silicon oxide.

Additionally, the non-metallic regions may include dicing lanes and/or areas in individual dies on the first wafer not provided with the first metal layer.

Additionally, after the CMP process is performed on the second modification layer and the first modification layer, the wafer bonding method may further include:
  forming a first dielectric layer on the remaining second and first modification layers; forming openings in the first dielectric layer by etching; and filling a first interconnect layer in the openings, wherein the portion of the first dielectric layer has second convex portions or second concave portions above the non-metallic regions;

providing a second wafer with third convex portions complementary to the second concave portions or third concave portions complementary to the second convex portions; and bonding the first wafer and the second wafer.

Additionally, the polishing rate of the polishing slurry for the first modification layer may be higher than the polishing rate thereof for the second modification layer, resulting in the formation of the first convex portions above the non-metallic regions.

Alternatively, the polishing rate of the polishing slurry for the first modification layer may be lower than the polishing rate thereof for the second modification layer, resulting in the formation of the first concave portions above the non-metallic regions.

The present invention also provides a wafer bonding structure, including:

a first wafer including a first substrate and a first metal layer located above the first substrate, wherein the first wafer having non-metallic regions and metallic regions provided with the first metal layer;

a first modification layer covering the first metal layer and the first substrate, wherein a portion of the first modification layer located above the non-metallic regions is recessed with respect to a portion of the first modification layer located above the metallic regions; and a second modification layer located above the non-metallic regions and covering the first modification layer, wherein the second modification layer has a surface raised or recessed with respect to a surface of the first modification layer located above the metallic regions, resulting in the formation of first convex portions or first concave portions above the non-metallic regions.

The wafer bonding structure may further include:

a first dielectric layer covering the first and second modification layers, wherein the first dielectric layer is provided therein with openings, and wherein the first dielectric layer has second convex portions or second concave portions above the non-metallic regions;

a first interconnect layer filled in the openings; and a second wafer provided with third convex portions or third concave portions, wherein the first wafer and the second wafer are bonded such that the third convex portions are complementarily received in the second concave portions or that the second convex portions are complementarily received in the third concave portions.

The present invention also provides a chip bonding structure, including:

a first chip including a first substrate and a first metal layer located above the first substrate, wherein the first chip comprises non-metallic regions and metallic regions provided with the first metal layer;

a first modification layer covering the first metal layer and the first substrate, wherein a portion of the first modification layer located above the non-metallic regions is recessed with respect to a portion of the first modification layer located above the metallic regions; and a second modification layer located above the non-metallic regions and covering the first modification layer, wherein the second modification layer has a surface raised or recessed with respect to a surface of the first modification layer located above the metallic regions, resulting in the formation of first convex portions or first concave portions above the non-metallic regions.

The chip bonding structure may further include:

a first dielectric layer covering the first modification layer and the second modification layer, wherein the first dielectric layer is provided therein with openings, and wherein the first dielectric layer has second convex portions or second concave portions above the non-metallic regions;

a first interconnect layer filled in the openings; and a second chip provided with third convex portions or third concave portions, wherein the first chip and the second chip are bonded such that the third convex portions are complementarily received in the second concave portions, or that the second convex portions are complementarily received in the third concave portions.

Compared with the prior art, the present invention offers the following advantages:

In the wafer bonding structure, wafer bonding method and chip bonding structure of the present invention, the first wafer has the non-metallic regions and metallic regions provided with the first metal layer, and a portion of the first modification layer located above the non-metallic regions is recessed with respect to a portion of the first modification layer located above the metallic regions. Additionally, the second modification layer covers the first modification layer, and as a result of the CMP process performed on the second modification layer and the first modification layer, which uses the polishing slurry that exhibits different polishing rates for the first modification layer and the second modification layer, the remaining second modification layer on the non-metallic regions is raised or recessed with respect to the remaining first modification layer above the metallic regions, resulting in the formation of the first convex or concave portions above the non-metallic regions. When this wafer is bonded to a wafer or dies with corresponding concavities or convexities, less gaps will be left from the bonding, improving process quality and product yield. Moreover, local concavities resulting from the CMP process can be eliminated or reduced, alleviating the problem of gaps left between bonded upper and lower wafers and achieving enhanced bonding strength and quality.

DESCRIPTION OF REFERENCE NUMERALS IN DRAWINGS

10: First Wafer; 101: First Substrate; 102: First Insulating Layer; 103: First Metal Layer; 104a: First Modification Layer; 104b: Second Modification Layer; 105: First Dielectric Layer; 106: First Interconnect Layer;

20: Second Wafer; 201: Second Substrate; 202: Second Insulating Layer; 203: Second Metal Layer; 204: Isolation Layer; 205: Second Dielectric Layer; 206: Second Interconnect Layer;

I: Metallic Region; II: Non-metallic Region; A₁: First Convex Portion; A₂: First Concave Portion;
B₁: Second Convex Portion; C₂: Third Concave Portion.

DETAILED DESCRIPTION

In view of the foregoing description, embodiments of the present invention provide a wafer bonding structure and a wafer bonding method. The present invention will be described in greater detail below with reference to particular embodiments and the accompanying drawings. Advantages and features of the present invention will become more apparent from the following description. Note that the figures are provided in a very simplified form not necessarily drawn to exact scale and for the only purpose of facilitating easy and clear description of the embodiments.

Figure 1:
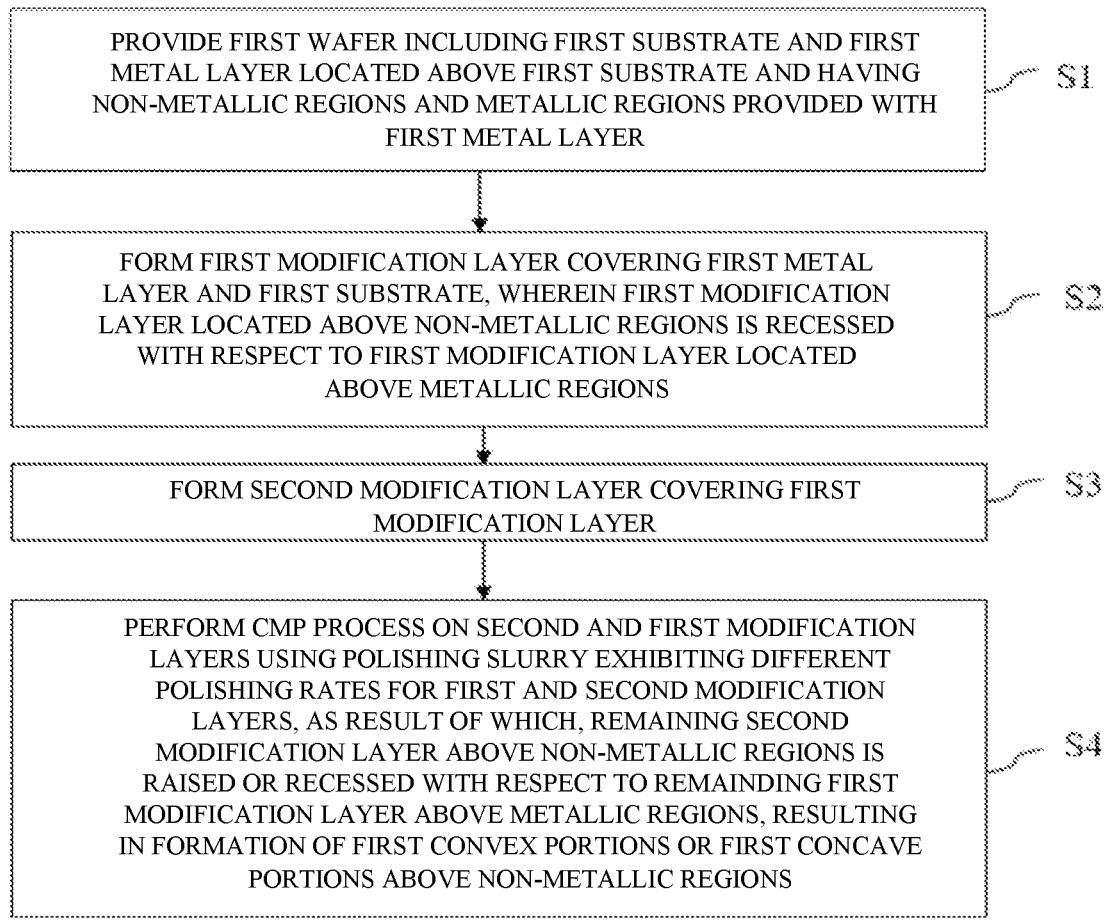
FIG. 1 is a schematic diagram showing a wafer bonding method according to an embodiment of the present invention.

In an embodiment of the present invention, there is provided a wafer bonding method, which, as shown in FIG. 1, includes:

providing a first wafer including a first substrate and a first metal layer located above the first substrate, wherein the first wafer comprises non-metallic regions and metallic regions provided with the first metal layer;

forming a first modification layer covering the first metal layer and the first substrate, wherein a portion of the first modification layer located above the non-metallic regions is recessed with respect to a portion of the first modification layer located above the metallic regions;

forming a second modification layer covering the first modification layer; and performing a chemical mechanical polishing (CMP) process on the second modification layer and the first modification layer, wherein a polishing slurry used by the CMP process exhibits different polishing rates for the first and second modification layers, so that the remaining second modification layer above the non-metallic regions is raised or recessed with respect to the remaining first modification layer above the metallic regions, leading to the formation of first convex portions or first concave portions above the non-metallic regions.

Steps in a wafer bonding method according to an embodiment of the present invention will be described below with reference to FIGS. 2 to 7.

Figure 2:
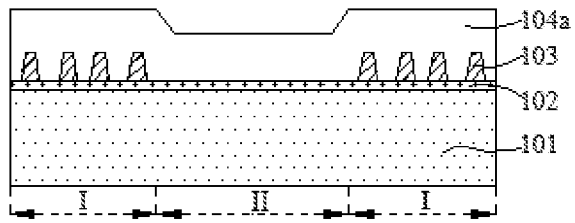
FIGS. 2, 3, 4a, 4b, 5, 6 and 7 are schematic diagrams showing steps in a wafer bonding method according to an embodiment of the present invention.

As shown in FIG. 2, a first wafer is provided, which includes a first substrate 101 and a first metal layer 103 above the first substrate 101. The first wafer has non-metallic regions II and metallic regions I provided with the first metal layer 103. The first wafer comprises an array of dies, and the non-metallic regions II include dicing lanes between the dies on the first wafer and/or areas in the individual dies on the first wafer not provided with the metal layer. In particular, the first substrate 101 may be provided thereon with a first insulating layer 102, and the first metal layer 103 may be located on the first insulating layer 102.

A first modification layer 104a covering the first metal layer 103 and the first substrate 101 is formed. A portion of the first modification layer 104a located above the non-metallic regions II is recessed with respect to a portion of the first modification layer 104a located above the metallic regions I.

Figure 3:
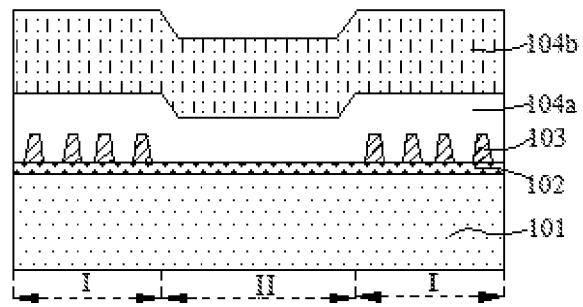

As shown in FIG. 3, a second modification layer 104b covering the first modification layer 104a is formed.

Figure 4A:
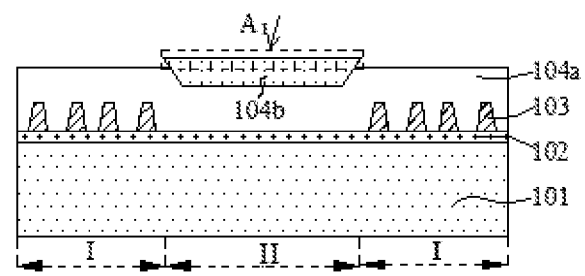
Figure 4B:
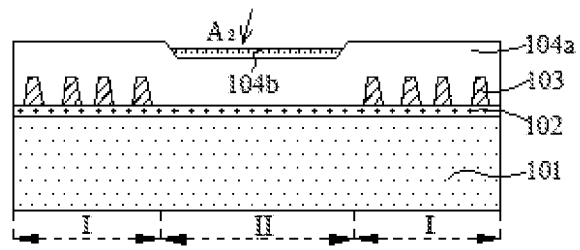

As shown in FIGS. 4a and 4b, a chemical mechanical polishing process is performed on the second modification layer 104b and the first modification layer 104a, which uses a polishing slurry exhibits different polishing rates for the first modification layer 104a and the second modification layer 104b. As a result, the remaining second modification layer 104b located above the non-metallic regions II is raised or recessed with respect to the remaining first modification layer 104a located above the metallic regions I, resulting in the formation of first convex portions A₁ or first concave portions A₂ above the non-metallic regions II.

The first modification layer 104a and the second modification layer 104b may be selected as different materials. Since the polishing slurry exhibits different polishing rates for different materials, the first convex portions A₁ or the first concave portions A₂ can be formed above the non-metallic regions II. Some substance may be added to the polishing slurry to modify the polishing rate of the polishing slurry for the first modification layer 104a or the second modification layer 104b.

FIG. 4a shows the case in which the first convex portions A₁ are formed above the non-metallic regions II as a result of the polishing rate of the polishing slurry for the first modification layer 104a being higher than that for the second modification layer 104b.

FIG. 4b shows the case in which the first concave portions A₂ are formed above the non-metallic regions II as a result of the polishing rate of the polishing slurry for the first modification layer 104a being lower than that for the second modification layer 104b. As an example, the polishing slurry is, for example, an alkaline solution, which may include silicon dioxide, hydrogen peroxide and an organic additive. The silicon dioxide and the hydrogen peroxide may be present at a ratio of 1:10 to 1:20. The first modification layer 104a may be any of silicon nitride, tantalum nitride or titanium nitride. The second modification layer 104b may be any of silicon oxide, tantalum oxide, aluminum oxide, hafnium oxide or FSG. The first modification layer 104a and the second modification layer 104b may be formed of the same or different materials using different deposition techniques. These deposition techniques enable the polishing slurry to have different polishing rates, thus forming various morphologies. As a result of the deposited first modification layer 104a and second modification layer 104b being polished at different rates, a morphology with convexities or concavities is obtained.

In particular, as shown in FIG. 2, the first modification layer 104a covering the first metal layer 103 and the first substrate 101 may be formed using a high density plasma-chemical vapor deposition (HDP-CVD) process. The HDP-CVD process involves simultaneous deposition and etching performed in the same reactor chamber. In particular, the deposition is generally accomplished by a reaction of $SiH_4$ and $O_2$, and the etching is generally accomplished by sputtering with Ar and $O_2$.

In this embodiment, the HDP-CVD process for forming the first modification layer 104a includes a pre-heating step and a deposition step. In the pre-heating step, the first wafer is heated with high density plasma generated in the chamber and its temperature rises from an initial temperature within the chamber. A final temperature of the first wafer as a result of the pre-heating step is higher than or equal to 400° C. and is lower than or equal to a temperature of the first wafer in the deposition step, which is, for example, in the range of 640° C. to 720° C. The heating in the pre-heating step may last for 15 seconds to 90 seconds.

In one preferred embodiment, process parameters of the deposition step include a chamber pressure of 5-10 mTorr, a top RF source power of 1200 W-1300 W, a side RF source power of 3000 W-3100 W and a bias RF power of 3200 W-3300 W. In the process, a gas containing argon at a flow rate of 105 sccm-115 sccm and oxygen at a flow rate of 120 sccm-130 sccm is introduced into the chamber from the top. Silane at a flow rate of 115 sccm-125 sccm is adopted as a silicon source. When deposition is carried out with those process parameters, the chamber and the first wafer are at a temperature of 680° C. to 700° C. under a steady condition.

The HDP-CVD process using the high density plasma in the reactor chamber allows for a low-temperature deposition, and the deposited first modification layer 104a has a variety of advantages including a high density and a low impurity content. Moreover, it exhibit excellent adhesion to the first metal layer 103 and the second insulating layer 102.

Subsequently, as shown in FIG. 3, the second modification layer 104b covering the first modification layer 104a is formed by a tetraethyl orthosilicate (TEOS) deposition process. The formation of the second modification layer 104b by TEOS deposition may include the steps as follows.

Liquid TEOS is vaporized into a gaseous form at a temperature of, for example, 80° C. to 120° C.

Oxygen ($O_2$) and the gaseous TEOS are introduced to a reactor chamber at a flow rate of 2000 sccm-4500 sccm and 500 sccm-1500 sccm, respectively. The gaseous TEOS may be introduced into the reactor chamber while being contained in an inert gas serving as a carrier. Examples of the inert gas include, but are not limited to, helium (He). A reaction temperature is kept in the reactor chamber in the range of 380° C. to 420° C.

The oxygen and gaseous TEOS are decomposed, and the resulting products react to form the second modification layer 104b. The decomposition of the oxygen and the gaseous TEOS may be accomplished by applying thereto an RF power of 300 W to 800 W. The second modification layer 104b formed in this way is denser in texture and more resistant to abrasion.

After that, as shown in FIGS. 3 and 4a, a chemical mechanical polishing (CMP) process is performed on the second modification layer 104b until at least the first modification layer 104a located above the metallic regions I is exposed. In this process, a polishing slurry is used, which exhibits a polishing rate for the second modification layer 104b resulting from the TEOS deposition process that is lower than a polishing rate thereof for the first modification layer 104a resulting from the HDP-CVD process. As a result, first convex portions $A_1$ are formed above the non-metallic regions II. In particular, both the first modification layer 104a and the second modification layer 104b may be, for example, both silicon oxide layers.

After the CMP process reaches a desired thickness, the non-metallic regions II (e.g., including dicing lanes and/or areas in the individual dies on the first wafer not provided with the metal layer) are covered by the two silicon oxide layers. Since the polishing slurry exhibits a lower polishing rate for the second modification layer 104b from the TEOS process, microscopic convexities, i.e., the first convex portions $A_1$, will be formed above the regions. An accurate amount of convexity can be achieved by controlling the thicknesses of the silicon oxide layers and the removed thickness.

Thus, above the first metal layer 103, the first modification layer 104a is formed by high density plasma (HDP) deposition and the second modification layer 104b by TEOS deposition. Through controlling the thicknesses of the two silicon oxide layers grown in the processes and the thickness removed in the polishing process, the non-metallic regions II (e.g., including dicing lanes and/or areas in the individual dies on the first wafer not provided with the metal layer) are covered by two silicon oxide layers. Due to the polishing rate ratio of the polishing slurry used in the CMP process, the second modification layer 104b formed by the TEOS process is eroded slower, resulting in the formation of the first convex portions $A_1$ above the non-metallic regions II.

Figure 5:
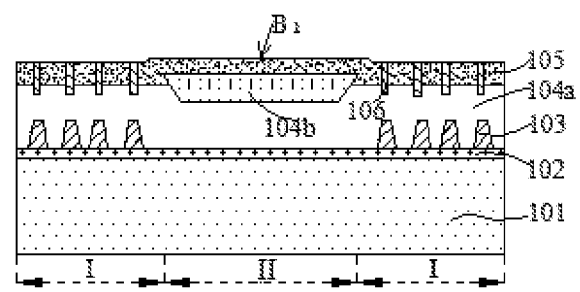

As shown in FIG. 5, a first interconnect layer 106 is formed, and a first dielectric layer 105 is formed on the remaining second modification layer 104b and the first modification layer 104a. Openings are formed by etching in the first dielectric layer 105. Each of the openings extends through the first dielectric layer 105 and a partial thickness of the first modification layer 104a. The first interconnect layer 106 is filled in the openings. The first interconnect layer 106 is electrically connected (not shown) to the first metal layer 103 in order to pick up electrical signals from the first wafer 10. The first interconnect layer 106 may be formed of a metal such as copper or tungsten. Since a relatively small amount of removal in the CMP process, the entire top surface maintains the same morphology as that before the process. That is, the first dielectric layer 105 also has convexities above the non-metallic regions II, referred to hereinafter as second convex portions $B_1$. The second convex portions $B_1$ are located on a bonding surface right above the respective first convex portions $A_1$.

Figure 6:
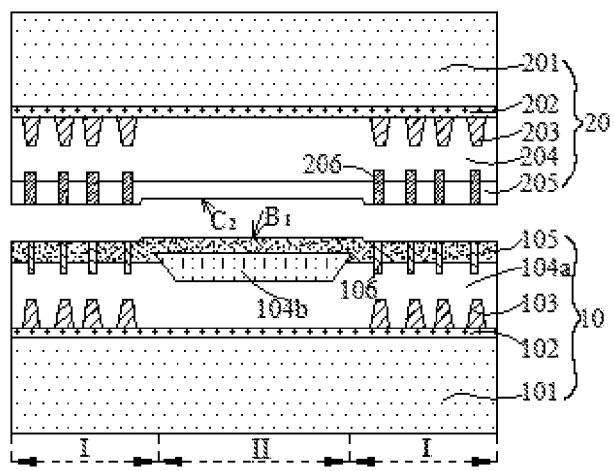

As shown in FIG. 6, a second wafer 20 is provided, which includes a second substrate 201 and a second metal layer 203 located above the second substrate 201. The second wafer has non-metallic regions II and metallic regions I provided with the second metal layer 203. The second wafer 20 comprises an array of dies, and the non-metallic regions include dicing lanes between the dies on the second wafer 20 and/or areas in the individual dies on the second wafer 20 not provided with the metal layer. In particular, the second substrate 201 may be provided thereon with a second insulating layer 202, and the second metal layer 203 may be located on the second insulating layer 202. The second metal layer 203 is covered by an isolation layer 204, and a second dielectric layer 205 is formed on the isolation layer 204. Additionally, a second interconnect layer 206 is embedded in the second dielectric layer 205 and the isolation layer 204. The second interconnect layer 206 is electrically connected (not shown) to the second metal layer 203 in order to pick up electrical signals from the second wafer 20. The second wafer 20 has third convex portions (not shown) or third concave portions $C_2$. The first wafer may be controlled to have convexities or concavities so as to match the second wafer 20. The second wafer 20 may have third concave portions $C_2$. As an example, the third concave portions $C_2$ may be portions of the second dielectric layer 205 above the non-metallic regions II of the second wafer 20.

The isolation layer 204 of the second wafer 20 may be either a single-layer structure or a composite isolation layer. In the latter case, the isolation layer 204 may include a first isolation layer and a second isolation layer (not shown). These isolation layers may be structured in the same away as the modification layers (the first modification layer 104a and the second modification layer 104b) of the first wafer 10. As an example, the first isolation layer covers the second metal layer 203 and the second substrate 201, and the first isolation layer located above the non-metallic regions II is recessed with respect to the first isolation layer located above the metallic regions I. Additionally, the second isolation layer is located above the non-metallic regions II, covers the first isolation layer and is raised or recessed with respect to the first isolation layer above the metallic regions I. In this way, convexities or concavities are formed above the non-metallic regions II. The second dielectric layer 205 covers the isolation layer 204, and the third convex or concave portions are correspondingly formed above the non-metallic regions II. The formation methods, structures and materials of the first and second isolation layers may be the same as those of the first modification layer 104a and the second modification layer 104b. Reference can be made to the formation methods, structures and materials of the first modification layer 104a and the second modification layer 104b, and no further description in this regard will be presented here.

Figure 7:
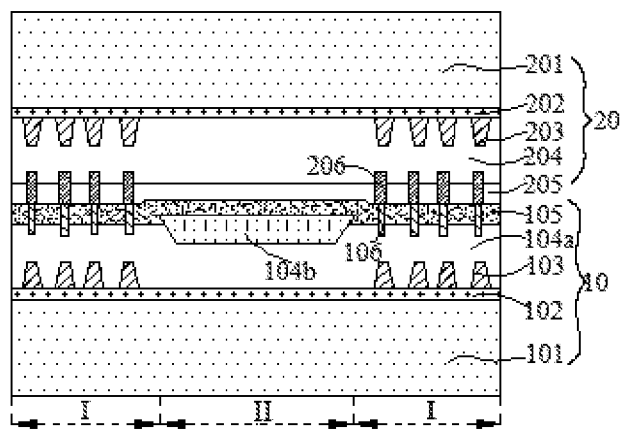

As shown in FIGS. 6 and 7, the first wafer 10 and the second wafer 20 are bonded together by hybrid bonding, with the second convex portions $B_1$ being complementarily received in the third concave portions $C_2$. The complementary reception of the second convex portions $B_1$ of the first wafer 10 in the third concave portions $C_2$ of the second wafer 20 above the non-metallic regions II can reduce gaps left after bonding. Thus, through complementary reception of microscopic concavities in microscopic convexities on the bonding surfaces above the non-metallic regions II (e.g., dicing lanes) of the second wafer can reduce gaps left after bonding, improving process quality and product yield.

The present invention also provides a wafer bonding structure, which as shown in FIGS. 4a to 7, includes:
  a first wafer 10 including a first substrate 101 and a first metal layer 103 above the first substrate 101, the first wafer 10 having non-metallic regions II and metallic regions I provided with the first metal layer 103;
  a first modification layer 104a covering the first metal layer 103 and the first substrate 101, wherein a portion of the first modification layer 104a above the non-metallic regions II is recessed with respect to a portion of the first modification layer 104a located above the metallic regions I; and
  a second modification layer 104b located above the non-metallic regions II and covering the first modification layer 104a, the second modification layer 104b raised or recessed with respect to the first modification layer 104a located above the metallic regions I, resulting in the formation of first convex portions $A_1$ or first concave portions $A_2$ above the non-metallic regions II.

In particular, the first modification layer 104a and the second modification layer 104b may be so configured that a polishing slurry exhibits different polishing rates for them.

The wafer bonding structure may further include:
  a first dielectric layer 105 covering the first modification layer 104a and the second modification layer 104b, the first dielectric layer 105 provided therein with openings, the first dielectric layer 105 having second convex portions $B_1$ or second concave portions above the non-metallic regions II;
  a first interconnect layer 106 filled in the openings; and
  a second wafer 20 with third convex portions (not shown) or third concave portions $C_2$,
  wherein the first wafer and the second wafer are bonded together in such a manner that the third convex portions are complementarily received in the second concave portions or that the second convex portions $B_1$ are complementarily received in the third concave portions $C_2$.

As shown in FIG. 7, in this embodiment, in the wafer bonding structure, the non-metallic regions II include dicing lanes between dies arranged into an array on the first wafer 10 and/or areas in the individual dies on the first wafer not provided with the metal layer. The non-metallic regions further include dicing lanes between dies arranged into an array on the second wafer 20 and/or areas in the individual dies on the second wafer 20 not provided with the metal layer.

In case of the non-metallic regions II being areas in the individual dies on the first wafer 10 and the second wafer 20 not provided with the metal layers, or of the non-metallic regions II being areas in the individual dies on the first wafer 10 and the second wafer 20 not provided with the metal layers and dicing lanes between arrayed dies on the wafers, according to an embodiment, the wafer bonding structure may be diced into individual chip bonding structures as shown in FIG. 7 and described below. Correspondingly, the present invention also provides a chip bonding structure, including:
  a first chip including a first substrate and a first metal layer located above the first substrate, the first chip having non-metallic regions and metallic regions provided with the first metal layer;
  a first modification layer covering the first metal layer and the first substrate, wherein the first modification layer located above the non-metallic regions is recessed with respect to the first modification layer located above the metallic regions; and
  a second modification layer located above the non-metallic regions and covering the first modification layer, the second modification layer raised or recessed with respect to the first modification layer located above the metallic regions, resulting in the formation of first convex portions or first concave portions above the non-metallic regions.

The chip bonding structure may further include:
  a first dielectric layer covering the first modification layer and the second modification layer, the first dielectric layer provided therein with openings, the first dielectric layer having second convex portions or second concave portions above the non-metallic regions;
  a first interconnect layer filled in the openings; and
  a second chip with third convex portions or third concave portions,
  wherein the first chip and the second chip are bonded such that the third convex portions are complementarily received in the second concave portions or that the second convex portions are complementarily received in the third concave portions.

In summary, in the wafer bonding structure, wafer bonding method and chip bonding structure of the present invention, the first wafer comprises the non-metallic regions and metallic regions provided with the first metal layer, and a portion of the first modification layer located above the non-metallic regions is recessed with respect to a portion of the first modification layer located above the metallic regions. Additionally, the second modification layer covers the first modification layer, the CMP process is performed on the second modification layer and the first modification layer, which uses the polishing slurry that exhibits different polishing rates for the first modification layer and the second modification layer, so that the remaining second modification layer on the non-metallic regions is raised or recessed with respect to the remaining first modification layer above the metallic regions, resulting in the formation of the first convex or concave portions above the non-metallic regions. When this wafer is bonded to a wafer or dies with corresponding concavities or convexities, less gaps will be left from the bonding, improving process quality and product yield. Moreover, local concavities resulting from the CMP process can be eliminated or reduced, alleviating the problem of gaps left between bonded upper and lower wafers and achieving enhanced bonding strength and quality.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details of them.

The description presented above is merely that of a few preferred embodiments of the present invention and is not intended to limit the scope thereof in any sense. Any and all changes and modifications made by those of ordinary skill in the art based on the above teachings fall within the scope as defined in the appended claims.

What is claimed is:

1. A wafer bonding method, comprising:
providing a first wafer comprising a first substrate and a first metal layer located above the first substrate, wherein the first wafer comprises non-metallic regions and metallic regions provided with the first metal layer;
forming a first modification layer covering the first metal layer and the first substrate, wherein a portion of the first modification layer located above the non-metallic regions is recessed with respect to a portion of the first modification layer located above the metallic regions;
forming a second modification layer covering the first modification layer; and
performing a chemical mechanical polishing (CMP) process on the second modification layer and the first modification layer, wherein a polishing slurry used by the CMP process exhibits different polishing rates for the first and second modification layers, so that the first modification layer and a portion of the second modification layer remain above the non-metallic regions, and a portion of the first modification layer remains above the metallic regions, wherein a surface of the second modification layer remaining above the non-metallic regions is raised or recessed with respect to a surface of the first modification layer remaining above the metallic regions, resulting in a formation of first convex portions or first concave portions above the non-metallic regions.

2. The wafer bonding method of claim 1, wherein: the first modification layer is formed by a high density plasma-chemical vapor deposition (HDP-CVD) process; and the second modification layer is formed by a tetraethyl orthosilicate (TEOS) deposition process.

3. The wafer bonding method of claim 2, wherein the polishing rate of the polishing slurry for the second modification layer is lower than the polishing rate thereof for the first modification layer.

4. The wafer bonding method of claim 2, wherein the first modification layer is formed by the HDP-CVD process with process parameters including: a chamber pressure of 5 mTorr-10 mTorr; a top RF source power of 1200 W-1300 W; a side RF source power of 3000 W-3100 W; and a bias RF power of 3200 W-3300 W.

5. The wafer bonding method of claim 4, wherein the first modification layer is formed by the HDP-CVD process with process gas parameters including: an argon flow rate of 105 sccm-115 sccm; an oxygen flow rate of 120 sccm-130 sccm; and a silane flow rate of 115 sccm-125 sccm.

6. The wafer bonding method of claim 2, wherein the formation of the second modification layer by the TEOS deposition process comprises:

vaporizing liquid TEOS into gaseous TEOS;
introducing an oxygen and the gaseous TEOS into a reactor chamber; and
decomposing the oxygen and the gaseous TEOS and forming the second modification layer by a reaction of products resulting from the decomposition.

7. The wafer bonding method of claim 6, wherein:
the liquid TEOS is vaporized at a temperature of 80° C. to 120° C.;
the oxygen is introduced into the reactor chamber at a flow rate of 2000 sccm to 4500 sccm; and the gaseous TEOS is introduced into the reactor chamber at a flow rate of 500 sccm to 1500 sccm; and
the oxygen and the gaseous TEOS are decomposed by an RF, wherein a power of the RF ranges from 300 W to 800 W.

8. The wafer bonding method of claim 2, wherein each of the first modification layer and the second modification layer is formed of silicon oxide.

9. The wafer bonding method of claim 1, wherein the non-metallic regions include dicing lanes and/or areas in individual dies on the first wafer not provided with the first metal layer.

10. The wafer bonding method of claim 1, further comprising, after the CMP process is performed on the second modification layer and the first modification layer:
forming a first dielectric layer on the remaining second modification layer and the remaining first modification layer; forming openings in the first dielectric layer by etching; and
filling a first interconnect layer in the openings, wherein the portion of the first dielectric layer above the non-metallic regions has second convex portions or second concave portions;
providing a second wafer with third convex portions complementary to the second concave portions or third concave portions complementary to the second convex portions; and
bonding the first wafer and the second wafer.

11. The wafer bonding method of claim 1, wherein the polishing rate of the polishing slurry for the first modification layer is higher than the polishing rate thereof for the second modification layer, resulting in the formation of the first convex portions above the non-metallic regions.

12. The wafer bonding method of claim 1, wherein the polishing rate of the polishing slurry for the first modification layer is lower than the polishing rate thereof for the second modification layer, resulting in the formation of the first concave portions above the non-metallic regions.

13. A wafer bonding structure, comprising:
a first wafer comprising a first substrate and a first metal layer located above the first substrate, wherein the first wafer comprises non-metallic regions and metallic regions provided with the first metal layer;
a first modification layer covering the first metal layer and the first substrate, wherein a portion of the first modification layer located above the non-metallic regions is recessed with respect to a portion of the first modification layer located above the metallic regions;
a second modification layer located above the non-metallic regions and covering the first modification layer, wherein the second modification layer has a surface raised or recessed with respect to a surface of the first modification layer located above the metallic regions, resulting in a formation of first convex portions or first concave portions above the non-metallic regions; and a first dielectric layer covering the first modification layer and the second modification layer, wherein the first dielectric layer is provided therein with openings, wherein a first interconnect layer is filled in the openings, and wherein the first dielectric layer has second convex portions or second concave portions above the non-metallic regions.

14. The wafer bonding structure of claim 13, further comprising:
a second wafer provided with third convex portions or third concave portions,
wherein the first wafer and the second wafer are bonded such that the third convex portions are complementarily received in the second concave portions, or that the second convex portions are complementarily received in the third concave portions.

15. A chip bonding structure, comprising:
a first chip comprising a first substrate and a first metal layer located above the first substrate, wherein the first chip comprises non-metallic regions and metallic regions provided with the first metal layer;
a first modification layer covering the first metal layer and the first substrate, wherein a portion of the first modification layer located above the non-metallic regions is recessed with respect to a portion of the first modification layer located above the metallic regions;
a second modification layer located above the non-metallic regions and covering the first modification layer, wherein the second modification layer has a surface raised or recessed with respect to a surface of the first modification layer located above the metallic regions, resulting in a formation of first convex portions or first concave portions above the non-metallic regions; and
a first dielectric layer covering the first modification layer and the second modification layer, wherein the first dielectric layer is provided therein with openings, wherein a first interconnect layer is filled in the openings, and wherein the first dielectric layer has second convex portions or second concave portions above the non-metallic regions.

16. The chip bonding structure of claim 15, further comprising:
a second chip provided with third convex portions or third concave portions,
wherein the first chip and the second chip are bonded such that the third convex portions are complementarily received in the second concave portions, or that the second convex portions are complementarily received in the third concave portions.

* * * * *